(12) United States Patent
Kawai et al.

(10) Patent No.: US 6,232,744 B1
(45) Date of Patent: May 15, 2001

(54) METHOD OF CONTROLLING BATTERY CONDITION OF SELF-GENERATION ELECTRIC VEHICLE

(75) Inventors: Toshiyuki Kawai, Okazaki; Tetsuya Kobayashi, Anjo; Takashi Yamashita, Kariya, all of (JP)

(73) Assignees: Denso Corporation, Kariya; Nippon Soken, Inc., Nisho, both of (JP)

( * ) Notice: Subject to any disclaimer, the term of this patent is extended or adjusted under 35 U.S.C. 154(b) by 0 days.

(21) Appl. No.: 09/512,275

(22) Filed: Feb. 24, 2000

(30) Foreign Application Priority Data

| Feb. 24, 1999 | (JP) | ................... | 11-047000 |
| Mar. 5, 1999 | (JP) | ................... | 11-059309 |
| Dec. 16, 1999 | (JP) | ................... | 11-356921 |
| Dec. 24, 1999 | (JP) | ................... | 11-367565 |

(51) Int. Cl.$^7$ ............... H02J 7/00; B60K 1/00; B60L 1/00

(52) U.S. Cl. .......... 320/132; 320/136; 180/65.3; 307/10.1

(58) Field of Search ............ 320/134, 136, 320/162; 180/165, 65.3, 65.4, 65.8; 307/10.1, 10.7; 361/437

(56) References Cited

U.S. PATENT DOCUMENTS

5,917,305 * 6/1999 Faulk .................................. 320/106
6,147,473 * 11/2000 Koo .................................... 320/160

FOREIGN PATENT DOCUMENTS

| 908 737 A2 | 4/1999 | (EP) . |
| 10-38985 | 2/1998 | (JP) . |
| 10-51906 | 2/1998 | (JP) . |
| 10-215503 | 8/1998 | (JP) . |
| 11-121048 | 4/1999 | (JP) . |

* cited by examiner

*Primary Examiner*—Peter S. Wong
*Assistant Examiner*—Gregory J. Toatley, Jr
(74) *Attorney, Agent, or Firm*—Pillsbury Winthrop LLP

(57) ABSTRACT

This invention provides a method of controlling condition of an assembled battery mounted in a self-generation electric vehicle. The method is comprised of the following steps: detecting battery voltage and battery current repeatedly; estimating a constant-power voltage on the basis of the battery voltage and the battery current; setting a target voltage; comparing the constant-power-discharge voltage with the target voltage to provide a difference therebetween; and charging or discharging the battery to reduce the difference when the battery is not operated. The constant-power voltage is set as a function of a remaining capacity of the battery when a preset constant power is charged to or discharged from the battery.

16 Claims, 17 Drawing Sheets

METHOD OF CONTROLLING BATTERY CONDITION OF SELF-GENERATION ELECTRIC VEHICLE

CROSS REFERENCE TO RELATED APPLICATION

The present application is based on and claims priority from the following Japanese Patent Applications: Hei 11-47000, filed Feb. 24, 1999; Hei 11-59309, filed Mar. 5, 1999; Hei 11-356921, filed Dec. 16, 1999; and Hei 11-367565, filed Dec. 24, 1999; the contents of which are incorporated herein by reference.

BACKGROUND OF THE INVENTION

1. Field of the Invention

The present invention relates to a method of controlling condition of an assembled battery mounted in a self-generation electric vehicle such as a hybrid vehicle.

2. Description of the Related Art

An assembled battery mounted in an electric vehicle is discharged mostly when the vehicle accelerates and charged when the vehicle runs at a constant speed or decelerates. Therefore, it is necessary to maintain the condition of such a battery at a intermediate level between fully-charged level and fully discharged level.

In order to maintain the battery condition at the intermediate level, it is necessary to frequently detect the remaining capacity. In the past, the remaining capacity was estimated by summing up battery charging currents and battery discharging currents.

JP-A-10-51906 discloses such a method of controlling, as the battery condition, an SOC (State of Charge) ratio which represents the remaining capacity. Data related to terminal voltage and current of an assembled battery at a maximum normal SOC ratio and a minimum normal SOC ratio are stored in a map and are compared with an estimated SOC ratio calculated from currently detected terminal voltage and charge or discharge current of the battery.

If the estimated SOC ratio approaches the maximum normal SOC ratio, the battery is discharged. On the other hand, the battery is charged if the estimated SOC ratio approaches the minimum normal SOC ratio. This control is repeated frequently.

The more errors are accumulated in the estimated SOC ratio as more frequently the above steps are repeated. This may cause improper control of the battery condition.

In the disclosed method, the battery is always controlled so that the SOC ratio stays either at the maximum normal SOC ratio or at the minimum normal SOC ratio. If the battery is controlled at the minimum normal SOC ratio, it is difficult to supply driving energy from the battery to the wheels. On the other hand, if the battery is controlled at the maximum normal SOC ratio, it is difficult to charge the battery with the electric power regenerated from the driving energy of the wheels.

Further, because the assembled battery is comprised of a plurality of battery cells of different remaining capacities (or different SOC ratios) and deterioration speeds, it is always possible that any one of the battery cells is over-discharged or deteriorating.

SUMMARY OF THE INVENTION

A main object of the invention is to provide an improved method of controlling condition of an assembled battery of an electric vehicle which needs not a map.

According to a feature of the invention, a method of controlling condition of a battery of a self-generation electric vehicle comprising the following steps: detecting battery voltage and battery current repeatedly; estimating a constant-power voltage on the basis of the battery voltage and battery current, the constant-power voltage being a function of a remaining capacity of the battery when a preset constant power is charged to or discharged from the battery; setting a target voltage; comparing the constant-power-discharge voltage with the target voltage to provide a difference therebetween; and charging or discharging the battery to reduce the difference.

The following steps can be added to the above steps: setting a maximum-normal voltage and a minimum-normal voltage between a voltage level of the battery that is fully charged and a voltage level of the battery that is completely discharged; and stopping the battery current if the constant-power voltage level becomes out of a range between the maximum-normal voltage and the minimum-normal voltage.

Therefore, this method ensures accurate control of the battery condition.

The target voltage is preferably set at the middle of the maximum-normal voltage and the minimum-normal voltage.

Therefore, battery can be charged or discharged easily. This step also prevents any one of series-connected battery cells of an assembled battery from being over-discharged.

The above step may also have the following steps: estimating the remaining capacity of the battery by summing up the battery current; and correcting the estimated remaining capacity to the target remaining capacity when the constant-power voltage approaches the target voltage.

Therefore, errors are not accumulated in the estimated SOC ratio even if the step of estimating the remaining capacity is repeated, so that improper control of the battery condition can be prevented effectively.

The above step preferably includes a step of resetting battery condition. This step may be comprised of: setting a reference condition range that is defined by a preset voltage range and a preset remaining capacity range; setting an operation condition defined by the constant-power voltage and the estimated remaining capacity; and if the operation condition is found to be out of the reference condition range, controlling the battery current to change the operation condition to be out of a boundary defined by the maximum-normal voltage and the minimum-normal voltage and, subsequently controlling the battery current to return the constant-power voltage to the target voltage while the battery is not operated.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

A principle of controlling an assembled battery of a hybrid vehicle according to the invention is described with reference to FIG. 1–FIG. 9B.

Figure 1:
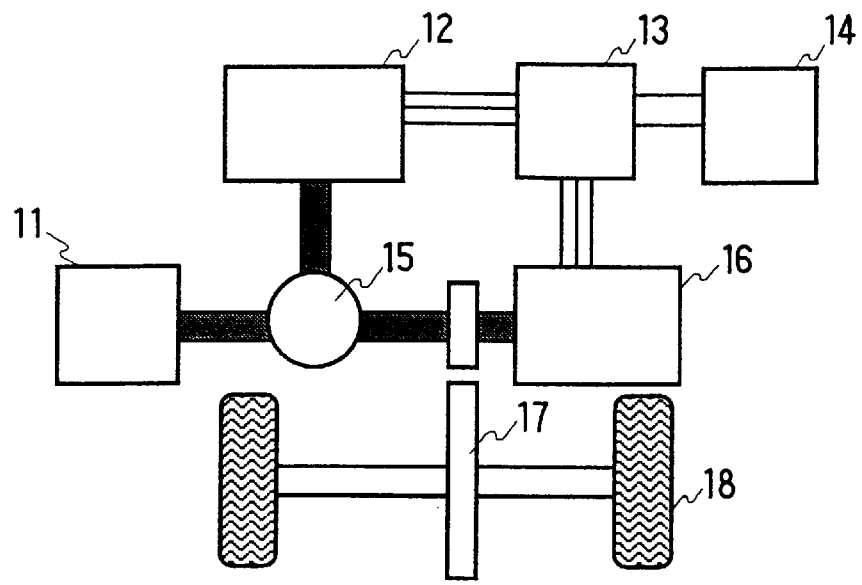
FIG. 1 is a block diagram illustrating a control system of a parallel hybrid vehicle.

In FIG. 1, a control system of a parallel hybrid vehicle includes engine 11, generator 12, inverter 13, assembled battery system 14, torque distributor 15, motor 16, speed reduction gear 17 and wheels 18.

Generator 12 is driven by a portion of driving power of engine 11 to generate electric output power. Inverter 13 supplies battery system 14 and motor 16 with electric power. Engine power is distributed by torque distributer 15 to wheels 18 and to generator 12. Motor 16 converts the electric power supplied thereto into driving power of wheels 18 and, when the vehicle is decelerated, the driving power of the wheels into electric power to be charged into battery system 14.

Figure 2:
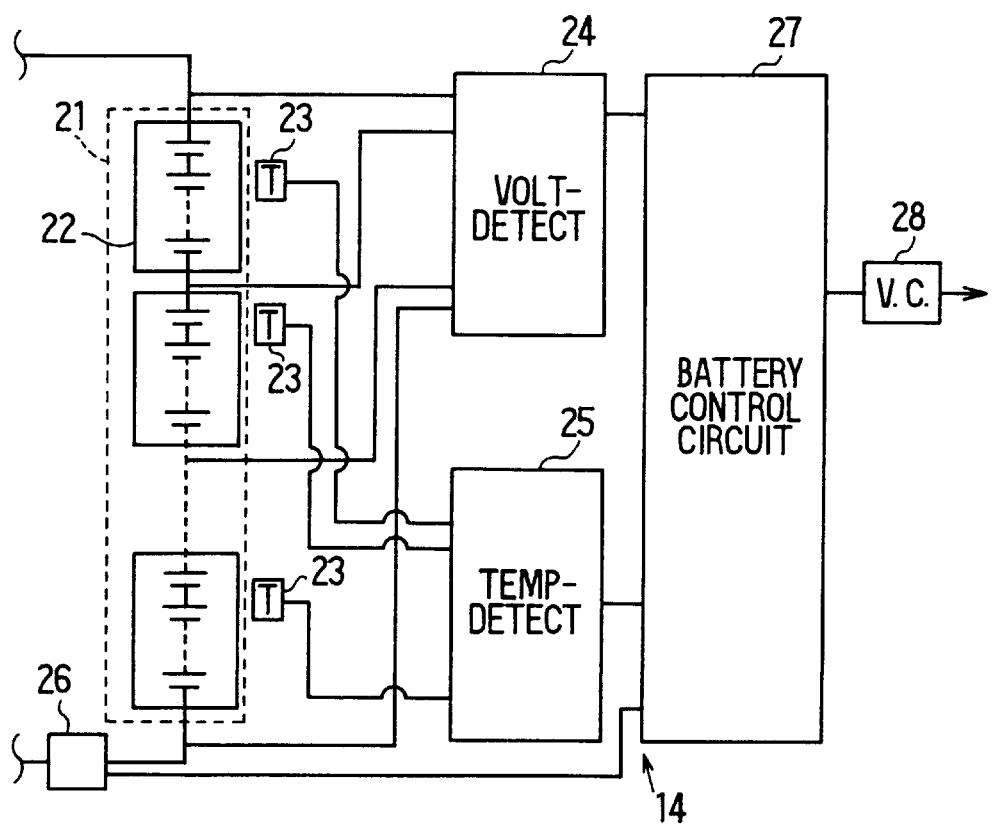
FIG. 2 is a block diagram illustrating battery cells and the related circuits thereof.

As shown in FIG. 2, battery system 14 includes a battery pack 21 having a plurality of series-connected modules 22, temperature sensor 23, voltage detecting circuit 24, battery temperature detecting circuit 25, battery current detecting circuit 26, battery control circuit 27, and vehicle control unit 28. Each module 22 is comprised of a plurality of battery cells. Battery control circuit 27 sums up terminal voltages of respective modules 22 to obtain the terminal voltage of battery pack 21. The capacity of battery pack 21 is calculated on the basis of the respective signals of voltage detecting circuit 24, battery temperature detecting circuit 25, and battery current detecting circuit 26. Battery control circuit 27 also provides data for controlling charging and discharging of battery pack 21.

Voltage detecting circuit 24 and temperature detecting circuit 25 can be connected to each battery cell if cost increase does not cause a big problem.

Figure 3:
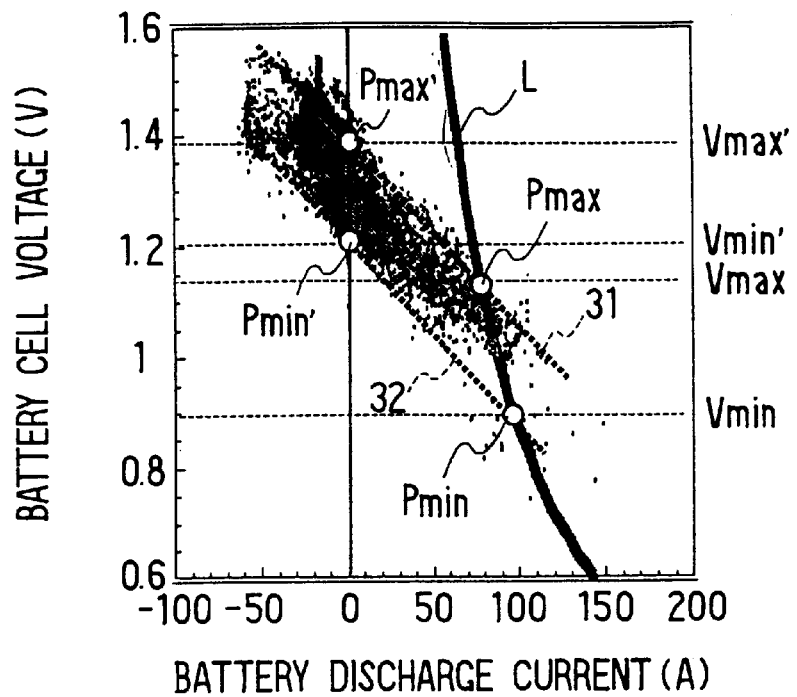
FIG. 3 is a graph showing operation characteristics of a battery cell of a nickel-hydrogen battery mounted in a hybrid vehicle.

In FIG. 3, curve L indicates terminal voltage of one of 240 series-connected battery cells of battery pack 21 relative to battery charging current when battery pack 21 discharges maximum normal power 21 kW.

Dotted line 31 shows current-voltage characteristics of the battery cell when battery pack 21 is fully charged.

Point Pmax at the intersection of curve L and line 31 represents voltage Vmax at full capacity of the battery cell when the battery pack 21 discharges the maximum normal power, 21 kW. Point Pmax' represents voltage Vmax' at full capacity of the battery cell when the current charged or discharged is 0.

Dotted line 32 shows current-voltage characteristics when battery pack 21 is almost completely discharged or at zero capacity.

Point Pmin at the intersection of curve L and line 32 represents voltage Vmin at zero capacity of the battery cell when the battery pack 21 discharges the maximum normal power, 21 kW. Point Pmin' represents voltage Vmin' at zero capacity of the battery cell when the current charged or discharged is 0.

Figure 4:
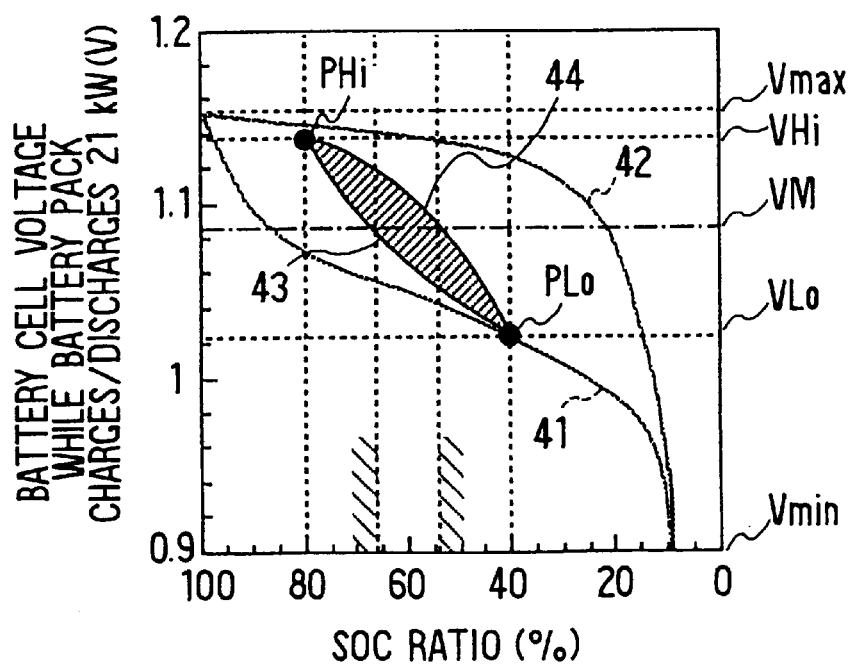
FIG. 4 is a graph showing charge-discharge characteristics of a battery cell relative to SOC ratios.

FIG. 4 shows voltage characteristics of a battery cell relative to SOC ratios while battery pack 21 discharges the maximum normal power. The SOC ratio represents battery capacity, and is expressed as follows:

SOC ratio=(remaining capacity)/(rated capacity)×100%.

In FIG. 4, curve 41 represents discharge voltage characteristics of a battery cell of battery pack 21 that is fully charged, and curve 42 represents charge voltage characteristics of the battery cell of the battery pack 21 that is almost completely discharged. Thus, curve 41 and curve 42 form a boundary hysteresis curve.

Curve 43 represents a lower boundary of normal voltage characteristics of the battery cell when battery pack 21 discharges the maximum normal power, 21 kW. It extends from maximum-normal point PHi, where the battery cell voltage is maximum-normal voltage VHi and the SOC ratio is 80%, to minimum-normal point PLo, where the battery cell voltage is minimum-normal voltage VLo and the SOC ratio is 40%. Curve 44, which extends from point PLo to point PHi, represents a upper boundary of normal voltage characteristics of the battery cell when battery pack 21 is charged with 21 kW. Thus, curves 43 and 44 form a small hysteresis curve. Target voltage VM is a voltage of the point approximately at the center of the area surrounded by curves 43 and 44 on the vertical line of SOC 60%.

Battery pack 21 is controlled to be charged or discharged so that the SOC ratio can stay between 80% and 40%. In other words, it is controlled so that the voltage of the battery cell can stay between maximum-normal voltage VHi and minimum-normal voltage VLo. Accordingly, if the voltage of the battery cell is around the target voltage VM, the SOC ratio is 60%±5%.

Figure 5:
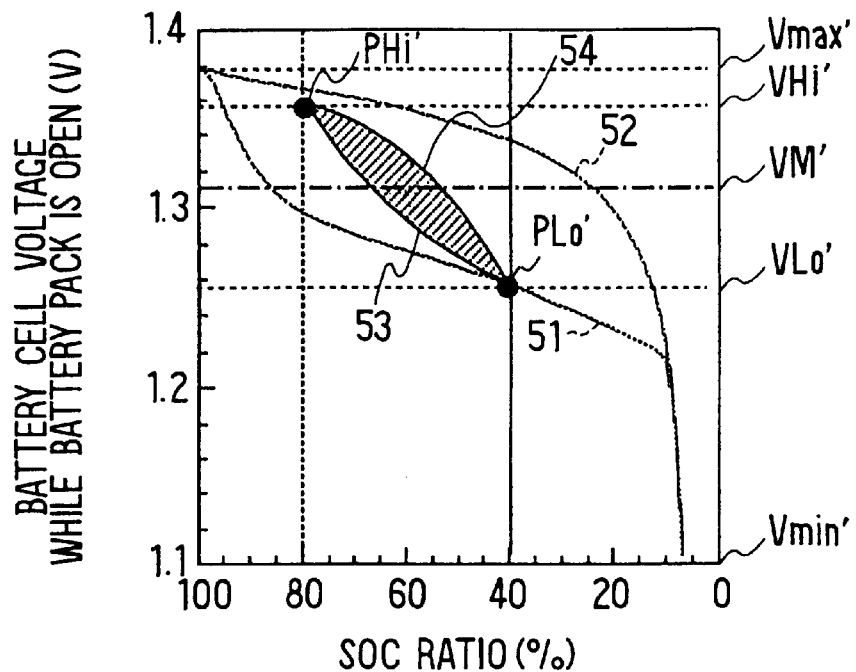
FIG. 5 is a graph showing charge-discharge characteristics of a battery cell relative to SOC ratios.

The target voltage VM can be determined according to a vehicle required power. No-load voltage VM' of the battery cell as shown in FIG. 5 or voltage with a certain load (not shown) can be substituted for VM. More accurate SOC ratio could be obtained if the charge-discharge characteristics of the battery cell are detected at various temperatures.

Figure 6:
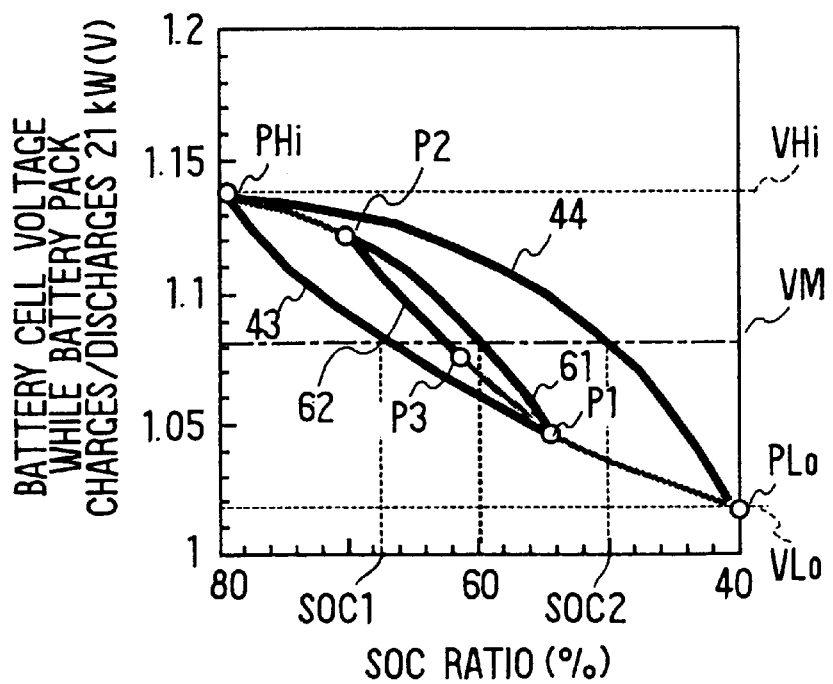
FIG. 6 is a graph showing charge-discharge characteristics of a battery cell relative to SOC ratios.

If the battery cell is charged and discharged repeatedly, the characteristic curves of the battery cell form many hysteresis curves within the boundary hysteresis curve as shown in FIG. 6.

In FIG. 6, if the battery cell is charged at minimum-normal point PLo with the SOC ratio being 40%, the voltage of the battery cell changes along charge characteristic curve 44 and the SOC ratio thereof becomes 80% at point PHi. If the same is discharged, the cell voltage changes from PHi along discharge characteristic curve 43 to point P1. If the same is charged again, the cell voltage changes along charge characteristic curve 61 to point P2 and finally to point PHi. If the same is discharged again at point P2, the cell voltage changes along discharge characteristic curve 62 to point P3 and further to point P1.

That is, if generator 12 is controlled so that the discharge voltage of the battery cell at a maximum normal power (hereinafter referred to as the constant-power voltage) approaches the target voltage VM as described above, the SOC ratio approaches 60%. In other words, as long as the operation point of the battery cell stays in the normally operable range surrounded by the boundary hysteresis curves 43 and 44, the SOC ratio returns to around 60%.

As shown in FIG. 6, SOC ratio 60% is at the middle of maximum and minimum normal SOC ratios, SOC1 on discharge characteristic curve 43 at target voltage VM and SOC2 on charge characteristic curve 44 at target voltage VM. Assuming that a vehicle runs with battery pack 21 with maximum-normal point PHi. If the vehicle is driven in a manner of spending battery power so that the operation point of the battery cell further moves along discharge characteristic curve 43 to point P1, the battery pack 14 is charged along charge characteristic curve 61 so that the constant-power voltage approaches the target voltage VM. Thus, the SOC ratio further approaches 60%.

Figure 7A:
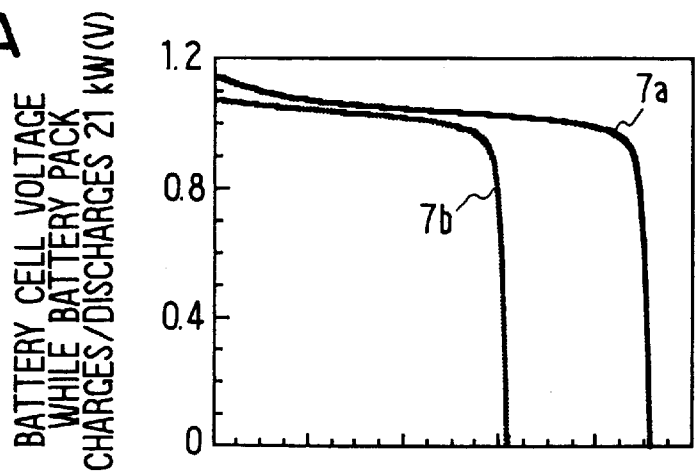
FIGS. 7A and 7B are graphs showing battery cell discharge characteristics relative to SOC ratios.

FIG. 7A is a graph showing discharge characteristics relative to the SOC ratios of one of 240 battery cells of an assembled battery which discharges the maximum-normal power of 21 kW. Curve 7a represents initial discharge characteristics, and curve 7b represents discharge characteristics when the SOC ratio of the battery decreases by 30%.

Figure 7B:
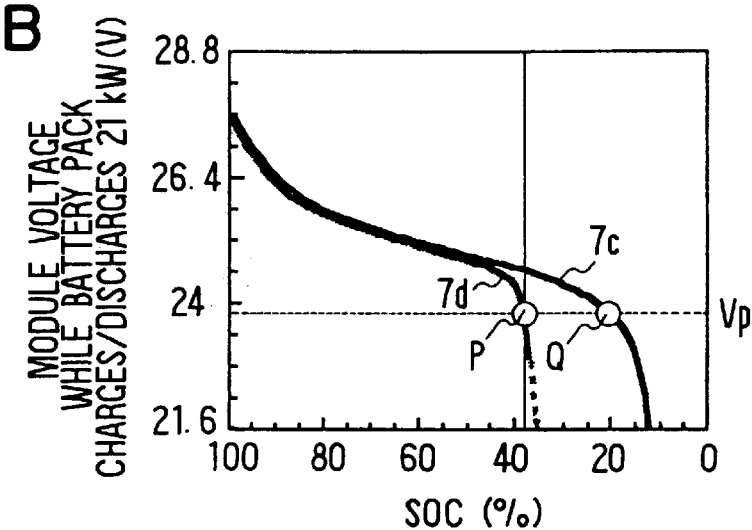

FIG. 7B is a graph showing discharge characteristics of two modules each of which includes 24 battery cells. Curve 7c represents discharge characteristics of a first module which includes all the battery cells that correspond to curve 7a of FIG. 7A, and curve 7d represents discharge characteristics of a second module which include 23 battery cells that correspond to curve 7a of FIG. 7A, and one battery cell that corresponds to curve 7b of FIG. 7A.

As the first module of 100%-SOC ratio is discharged, the discharge voltage decreases along curve C and sharply drops when the SOC ratio approaches 20%. The SOC ratio of point Q of curve C is much lower than 40% in SOC ratio. On the other hand, the discharge voltage of the second module of 100% in the SOC ratio decreases along curve D and sharply drops when the SOC ratio approaches 40%. Thus, the more the capacity of the battery cells is different from one another, the less the dischargeable power of the battery becomes.

If the second module is further discharged and the discharge voltage becomes minimum-normal voltage Vp (which corresponds to minimum-normal voltage VLo of the battery cell) at point P of curve D, the discharge voltage of the battery cell corresponding to curve B becomes less than 0 volt.

If the module discharges the maximum normal power and the module voltage becomes less than minimum-normal voltage Vp, the module is controlled to reduce discharge power from the maximum normal power. Thus, the voltage drop across the internal resistance is controlled so that the discharge voltage can be maintained to be not lower than minimum-normal voltage Vp.

A method of controlling the discharge power (discharge control method) is described with reference to FIG. 8 and FIGS. 9A and 9B.

Figure 8:
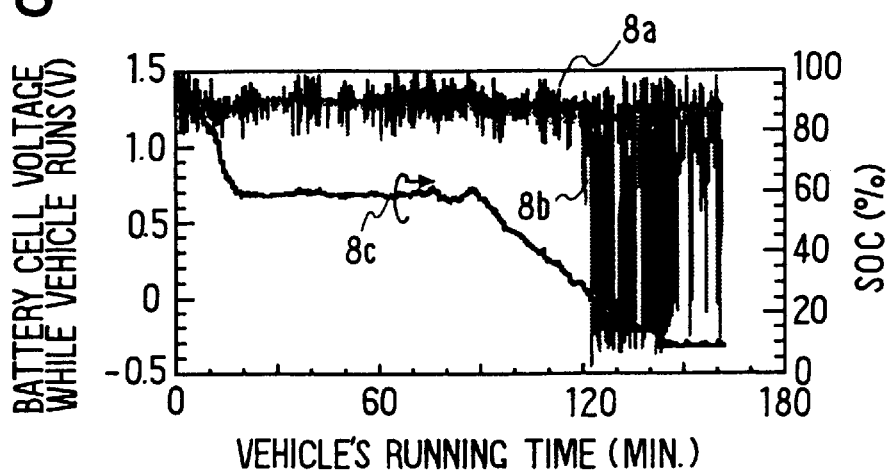
FIG. 8 is a graph showing terminal voltages and SOC ratios of a battery module including a battery cell of a different remaining capacity.

FIG. 8 is a graph showing discharge characteristics of a module including 24 battery cells including one battery cell whose capacity is 30% less than the others, where the SOC ratio is not controlled. Curve 8a represents average voltage change of the module (in terms of the voltage of one battery cell) relative to the vehicle running time. Curve 8b represents voltage changes of the 30%-less-capacity cell, and curve 8c represents average SOC ratios of the module. Curve 8b indicates that the 30%-less-capacity cell is overdischarged, and curve 8c indicates that the SOC ratio of the 30%-less-capacity cell decreases to 10%, which is 20% less than the normal SOC ratio.

Figure 9A:
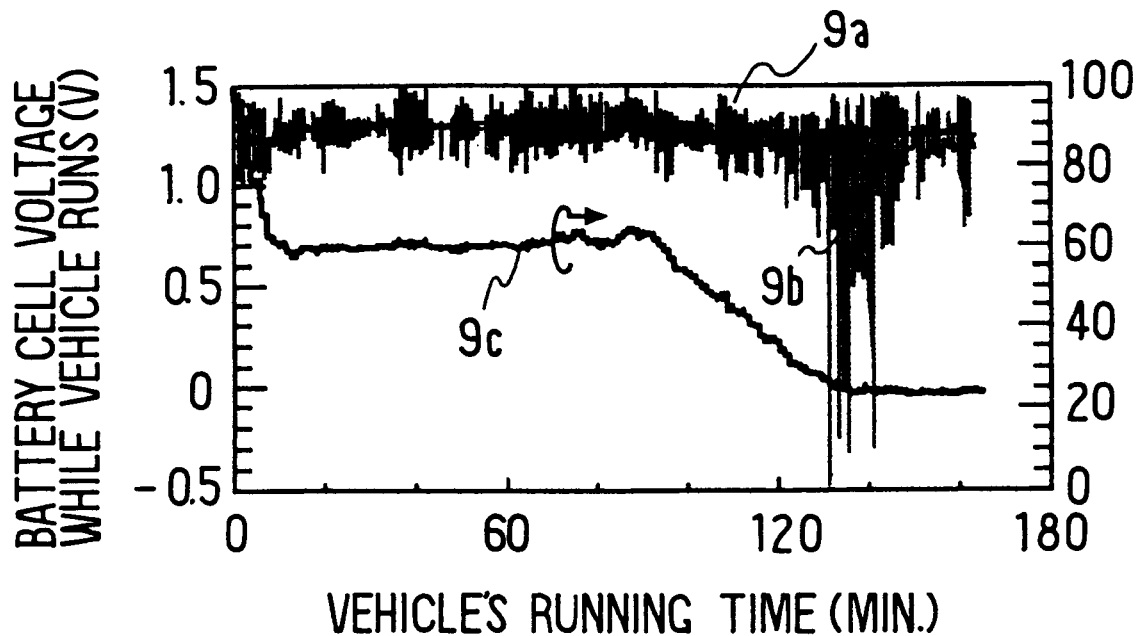
FIG. 9A is a graph showing terminal voltages of a battery module including a battery cell of a different remaining capacity.

FIG. 9A is a graph showing discharge characteristics of a module including 23 normal battery cells and one battery cell whose capacity is 30% less than the others, where the discharge power is controlled. Curve 9a represents average voltage change of the module (in terms of the voltage of one battery cell) relative to the vehicle running time. Curve 9b represents the voltage of the 30%-less-capacity cell, and curve 10c represents an average SOC ratio of the module. The discharge voltage of the module is controlled according to the voltage of curve 9a. Curve 9c indicates that the 30%-less-capacity cell is controlled to reduce frequency of being over-discharged, and curve 10c indicates that the SOC ratio of the 30%-less-capacity cell only decrease to 20%.

Figure 9B:
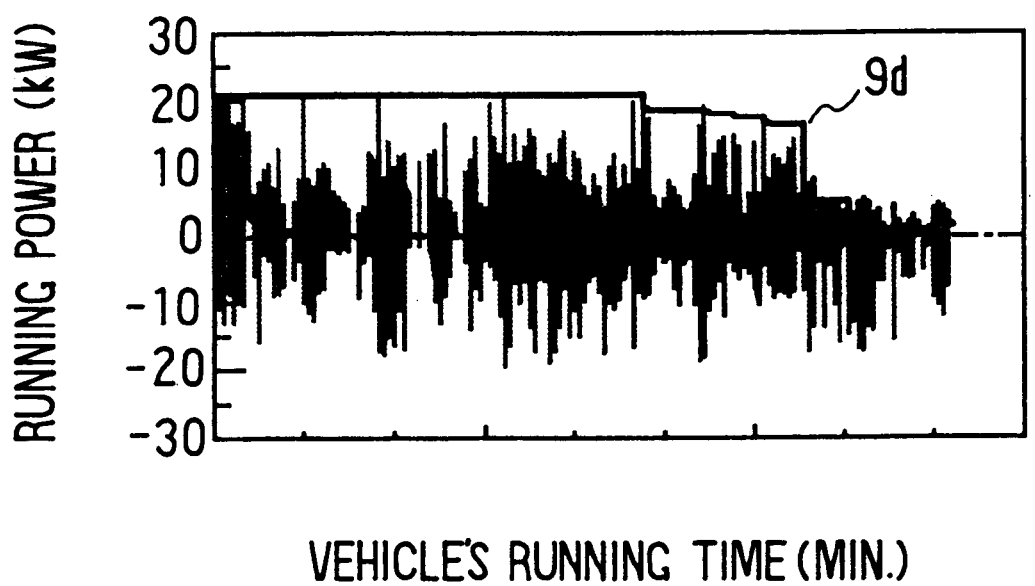
FIG. 9B is a graph showing discharging power characteristics of a battery module relative to vehicle running time.

FIG. 9B is a graph showing the total discharge power of the battery including 240 battery cells whose discharge power is controlled while a vehicle is running.

Curve 9d represents dischargeable power levels which do not decrease the discharge voltage of the modules to a level lower than the module's or the battery-cell's minimum-normal voltage.

Thus, the control of the discharging power is effective to prevent the discharge voltage of the modules from becoming less than the minimum-normal voltage.

(First Embodiment)

A method of controlling battery condition according to a first embodiment of the invention is described with reference to FIGS. 10–19.

At first, voltage of battery pack 21 and battery current charged to or discharged from battery pack 21 are detected to calculate target voltage VM. Then, if the detected constant-power voltage of the battery cell is as high as VHi, battery pack 21 is not further charged. On the other hand if the detected constant-power voltage is as low as VHo, battery pack 21 is not discharged. A provisionally SOC ratio is calculated separately by accumulating the battery currents detected repeatedly. This is corrected thereafter in the following manner.

When the provisionally calculated SOC ratio becomes 60%, battery pack 21 is charged or discharged so that the constant-power voltage becomes equal to target voltage VM, which should correspond to the real SOC ratio of 60% as described above. Thus, the charged or discharged current can be considered as an accumulation error, which is corrected at this stage.

Figure 10:
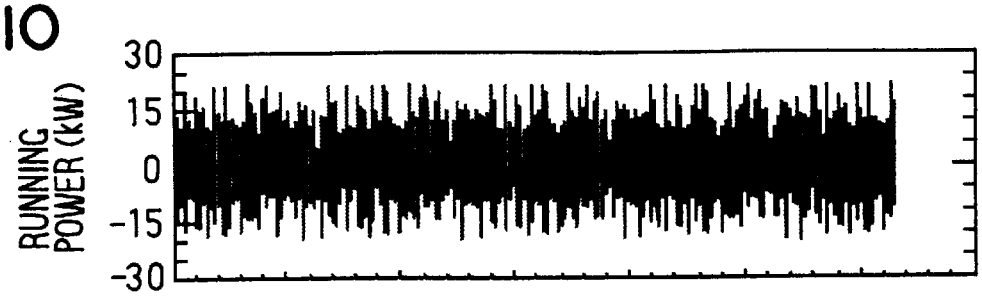
FIG. 10 is a timing chart showing running power in kW relative to vehicle running hour.
Figure 11:
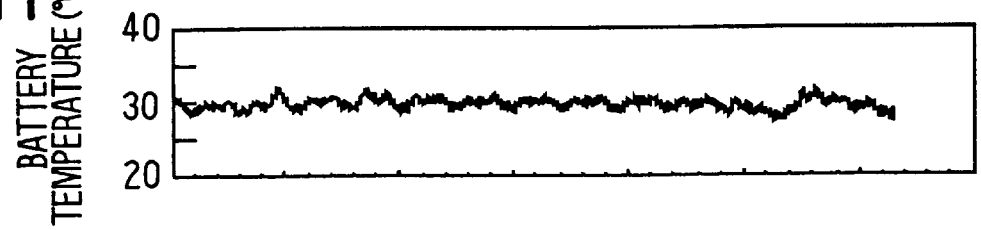
FIG. 11 is a timing chart showing average temperature change of the battery cells.
Figure 12:
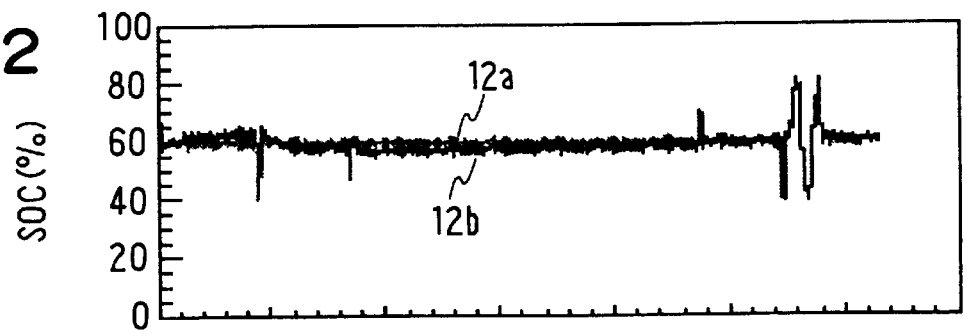
FIG. 12 is a timing chart showing a calculated SOC ratio curve and real SOC ratio curve.
Figure 13:
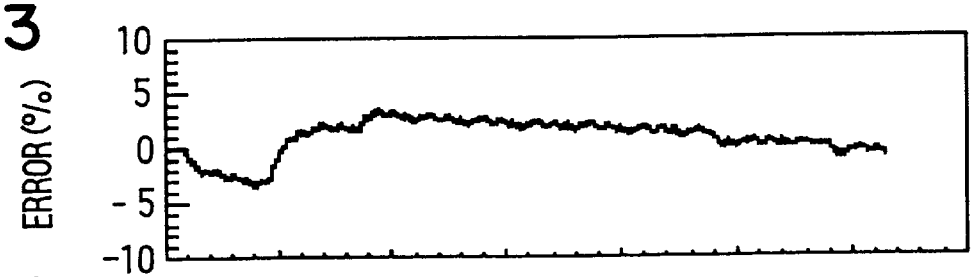
FIG. 13 is a timing chart showing differences in SOC ratio between the calculated SOC ratio curve and the real SOC ratio curve.
Figure 14:
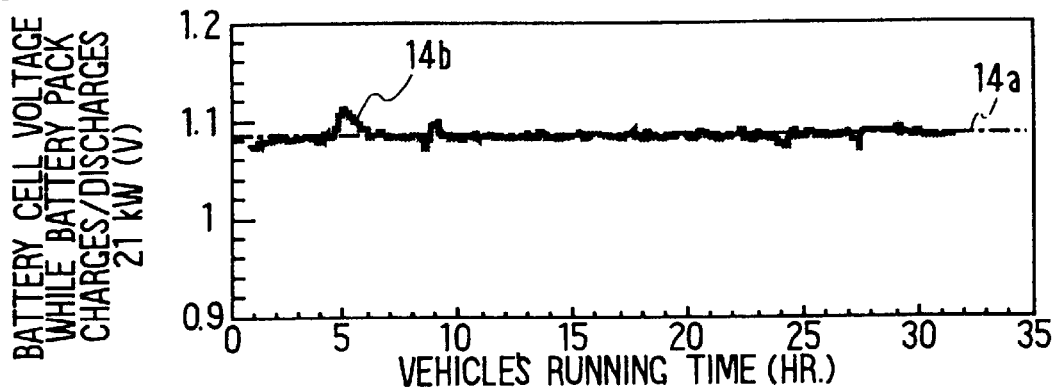
FIG. 14 is a timing chart showing differences between target voltage VM and 21 kW-constant-power voltage.
Figure 15:
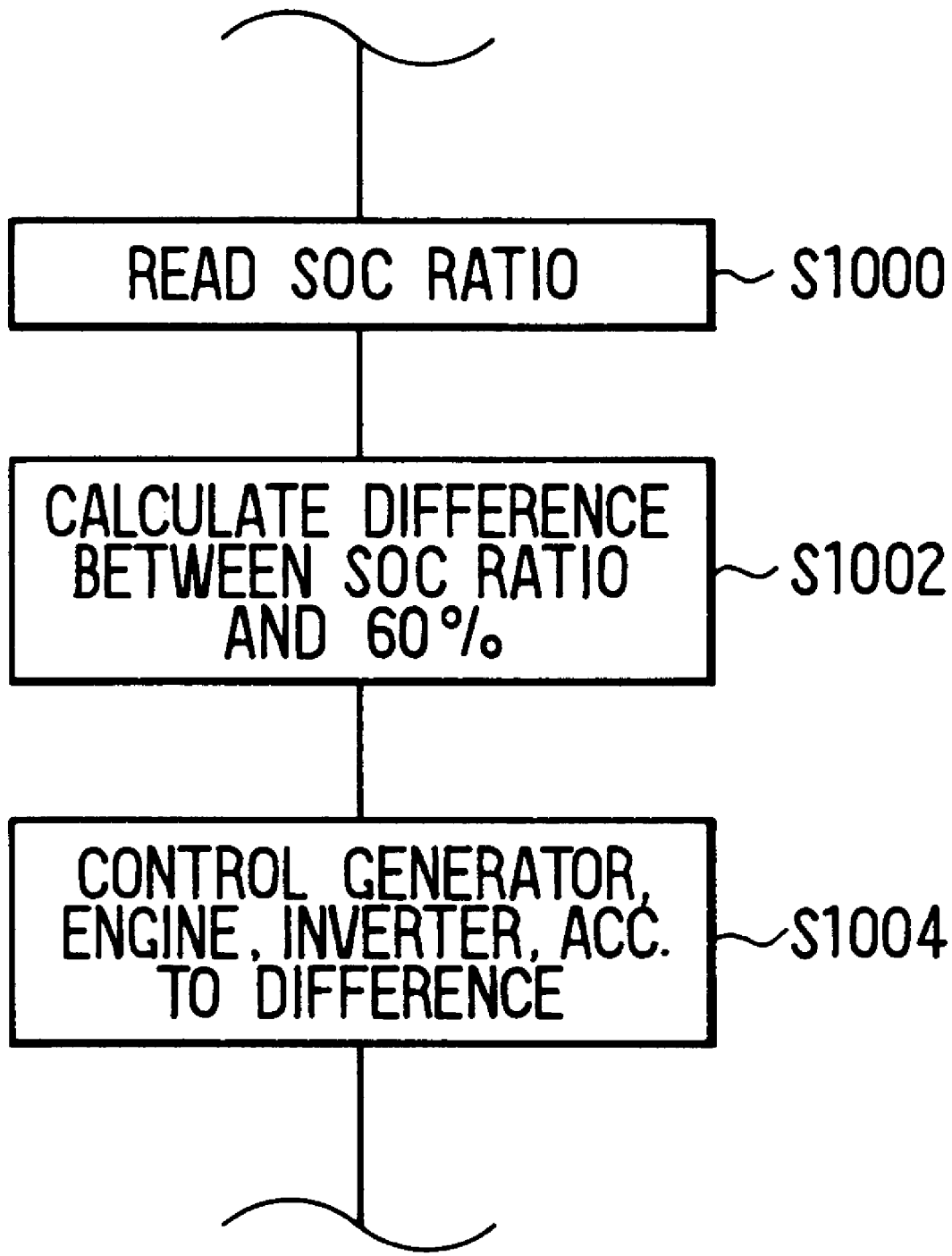
FIG. 15 is a flow diagram of controlling battery condition according to a first embodiment of the invention.

The operation of a hybrid vehicle in which the above 60%-SOC-ratio-control is carried out is shown in FIGS. 10–14. FIG. 10 shows running power in kW relative to vehicle running hour, FIG. 11 shows average temperature of the battery cells, FIG. 12 shows SOC ratio curve 12a calculated in the method according the invention and real SOC ratio curve 12b that was measured after the battery remaining capacity had been precisely measured. FIG. 13 shows differences in the SOC ratio between curve 12a and curve 12b. FIG. 14 shows differences between curve 14a of target voltage VM and curve 14b of the constant-power voltage (21kW-constant-power discharge-voltage). As shown in FIG. 14, the SOC ratio is controlled within 60%±4%. Control operation of vehicle control unit 28 is described with reference to FIG. 15. Vehicle control unit 28 controls engine 11 via a engine controller (not shown) according to data related to the vehicle load and the SOC ratio of battery pack 21.

At step S1000, the SOC ratio provided by battery control circuit 27 is read. The SOC ratio is then compared with a target SOC ratio to obtain required electric power at step S1002. At step S1004, a running power value, which is calculated beforehand, is added to the required electric power to provide a total required power. Then, engine 11 is controlled to provide engine power corresponding to the total required power in a well-known manner. Vehicle control unit 28 also controls generator 12 and motor 16 in a well-known manner.

The operation of battery control circuit 27 is described with reference to flow diagrams shown in FIGS. 16, 17 and 18.

At step S901, battery cell voltage VB, battery cell current IB, and battery cell temperature TB are detected. At step S902, the constant-power voltage VBw is calculated by the following equation. Internal resistance Rk is calculated by the least square method.

$$VBo = VB + Rk \times IB$$

$$VBw = \{VBo + (VBo^2 - 4 \times Rk \times \alpha)^{0.5}\} \times 0.5,$$

where VBo is a no-load voltage of the battery cell, and $\alpha$ is a portion of the maximum normal power (21 kW) allocated to each battery cell.

At step S903, the detected current values are accumulated to calculate the SOC ratio. That is:

SOC ratio=(remaining capacity)/(rated capacity)×100(%)

At step S904, whether the SOC ratio is 60±3% or not is examined. If the result is NO, step S907 follows. If YES, step S906 follows, where the constant-power voltage VBw is compared with target voltage VM. If VBw<VM, it is necessary to charge the battery pack. Then, the calculated SOC ratio is corrected to be lower than 60% so that vehicle control unit 28 can control engine 11, generator 12, and motor 16 to charge battery pack 21. On the other hand, if VBw>VM, it is necessary to discharge the battery pack. Then, the SOC ratio is corrected to be higher than 60% so that vehicle control unit 28 can control engine 11, generator 12, and motor 16 to discharge battery pack 21. Thus, vehicle control unit 28 controls engine 11, generator 12, and motor 16 step by step so that the actual SOC ratio stays around 60%. The correction of the SOC ratio each time is between 1 and 0.01%. The corrected SOC ratio is supplied to vehicle control unit 28 at step S907.

Then, whether the SOC ratio is within 60%–80%-SOC-ratio-control-range or not is examined at step S908.

Figure 17:
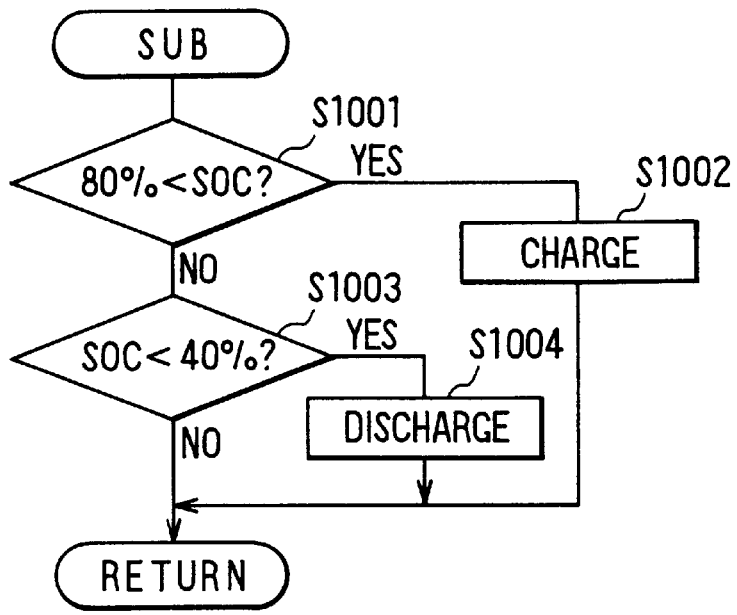
FIG. 17 is a flow diagram showing a method of controlling the SOC ratio of the assemble battery according to the first embodiment.
Figure 18:
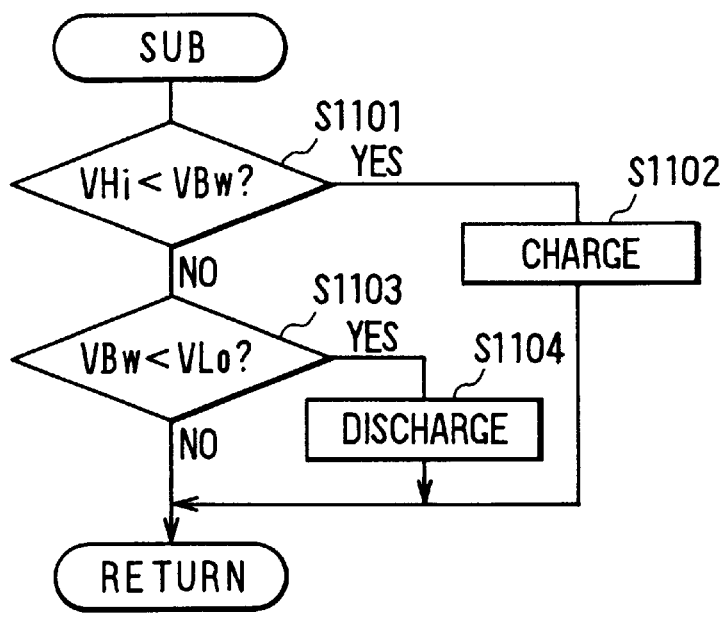
FIG. 18 is a flow diagram showing a variation of the method of controlling the SOC ratio of the assemble battery according to the first embodiment.

A sub routine of this step is shown in FIGS. 17 or 18. In FIG. 17, at step S1001, whether the SOC ratio is larger than 80% is examined. If the result is YES, a charge-stop command is sent to vehicle control unit 28 at step S1002. Other steps are readily understandable.

Instead of examining the SOC ratio, the constant-power voltage VBw or the no-load voltage VBo is compared with VHi or VHi' that corresponds to 80% SOC ratio at step S1101 shown in FIG. 18. If VHi<VBw, the charge stop command is sent to vehicle control unit 28 at step S1102. If VBw is found to be smaller than VLo at step S1103, the discharge stop command is sent to vehicle control unit 28 at step S1104. Instead of the constant-power voltage VBw, the no-load voltage VBo can be used in the steps as described before.

If the vehicle stops at step S909, control parameters are stored to be used to the next operation at step S910 before the operation ends.

Figure 19:
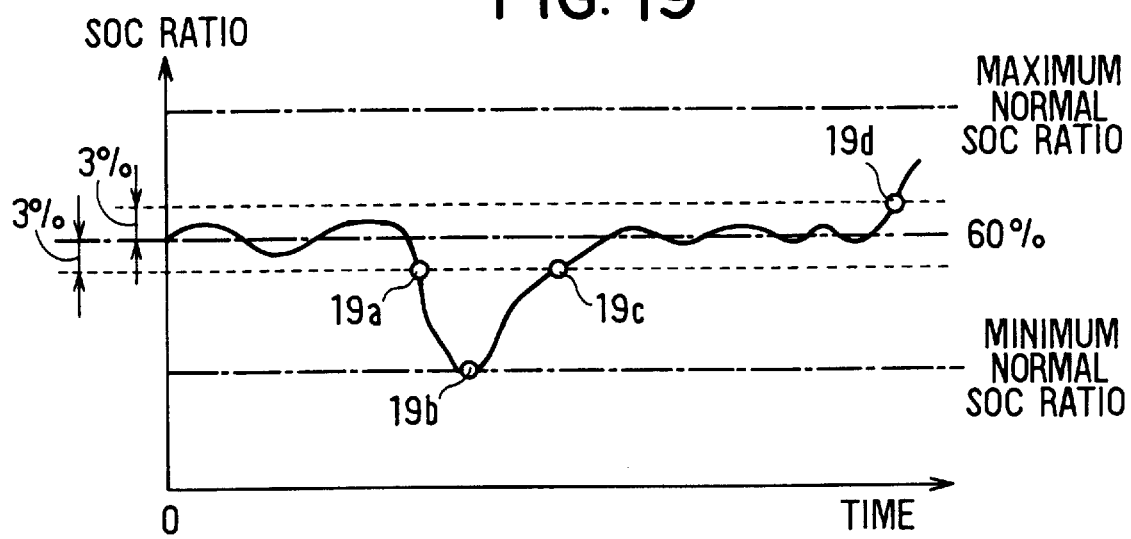
FIG. 19 is a timing chart showing change of SOC ratios relative to the vehicle running time.
Figure 20:
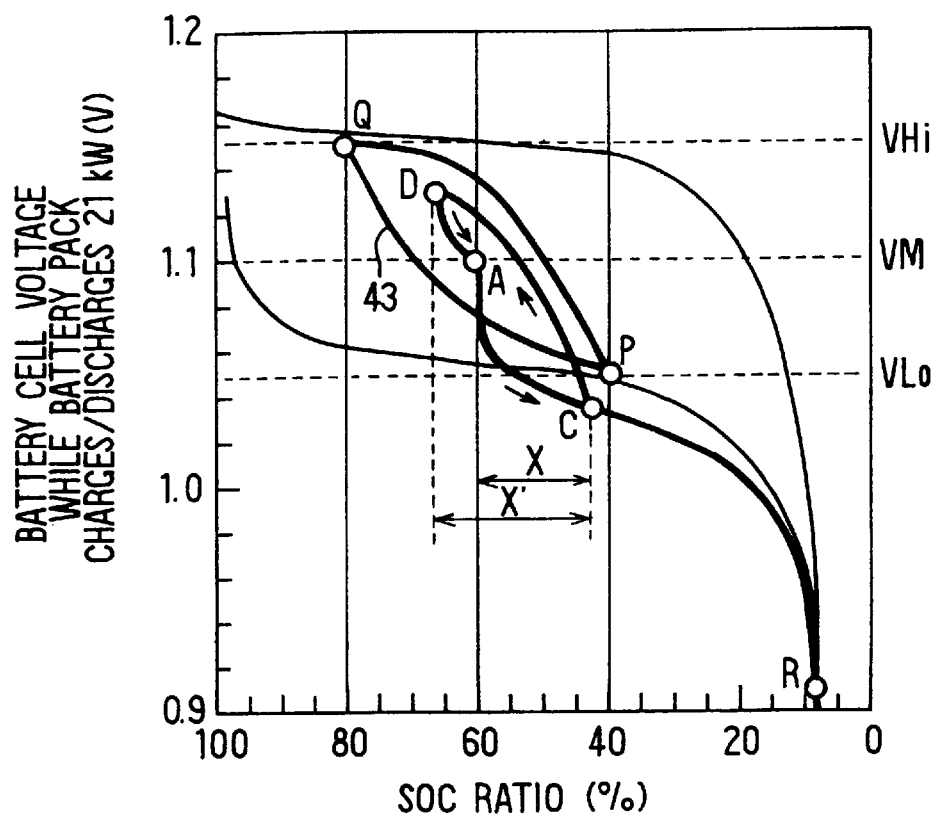
FIG. 20 is a graph showing a method of controlling the SOC ratio according to a second embodiment of the invention.

The above described SOC ratio changes as shown in FIG. 19. When the vehicle starts and runs at beginning until point 19a, the real SOC ratio stays within the set range 57%–63%. The detected SOC ratio is corrected at step S906. When the vehicle is driven in a manner to spend much battery power, the detected SOC ratio moves from point 19a to point 19b where the SOC ratio is much lower than 57%. Accordingly, discharge stop command is sent to vehicle control unit 28 at step S908, that is, at step S1004 or step S1104. Then, the detected SOC ratio returns to point 19c in the set range, and it is corrected again at step S906. Thus, detected SOC ratio can be corrected timely. When the vehicle is driven in a manner to charge much power to battery, the detected SOC ratio moves to point 19d where the SOC ratio is much higher than 63%. This is also controlled in substantially the same manner as described above.

(Second Embodiment)

A method of controlling battery condition according to a second embodiment of the invention is described with reference to FIGS. 16 and 20–24.

It has been found that the constant-power voltage does not always move along the normal characteristic curve, due to a deviation in memory effect and polarization of the battery cells. As a result, the SOC ratio can not be accurately controlled to approach 60%. The method according to the second embodiment will solve the above problem.

Figure 16:
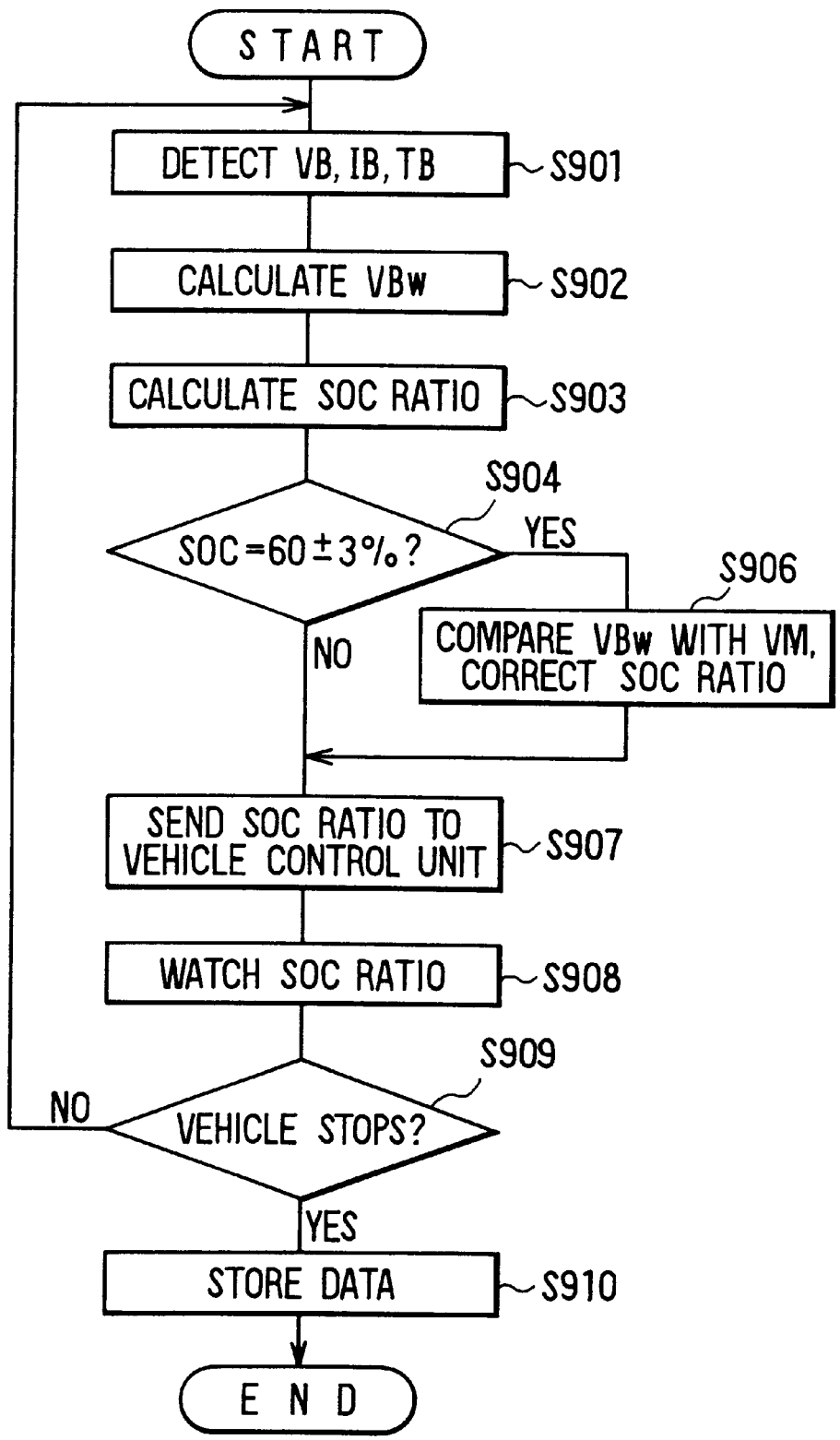
FIG. 16 is a flow diagram showing a method of controlling the SOC ratio of the assemble battery according to the first embodiment.
Figure 21:
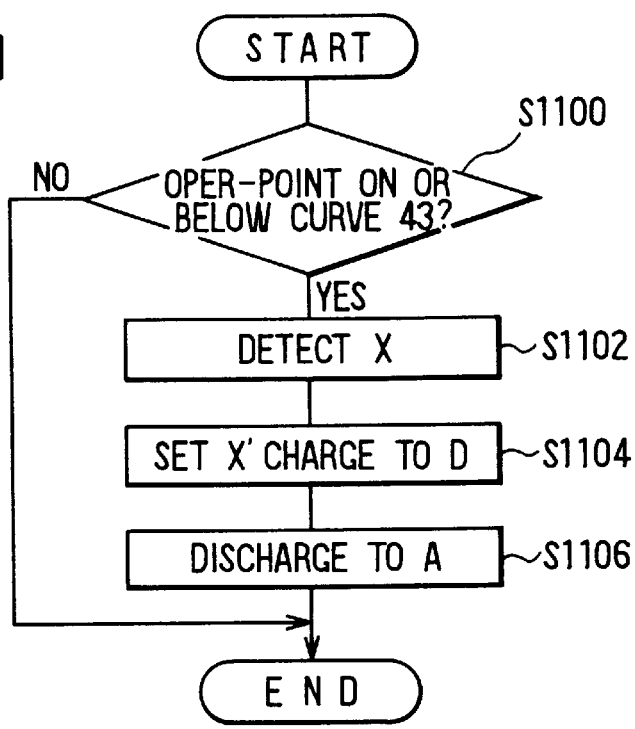
FIG. 21 is a flow diagram showing the method according to the second embodiment.

The constant-power voltage is controlled in almost the same manner as the first embodiment so that it can approach target voltage VM, and the following subroutine shown in FIG. 21 is added to the main routine shown in FIG. 16.

At step S1100, whether or not a present operating point (SOC ratio, constant-power voltage) is on or below curve 43 is examined. If the result is NO, the subroutine ends.

On the other hand, if the result is YES, difference x between 60% and the SOC ratio of operating point C, where charging of battery pack 21 starts, is detected at step S1102. At 1104, X is multiplied by a raising coefficient (between 1 and 2) to obtain X', and the battery pack 21 is charged so that the SOC ratio can increase by X'. In other words, the operation point moves to point D where the SOC ratio is larger than 60%. Thereafter, the battery cells are discharged so that the constant-power voltage becomes equal to target voltage VM at step S1106. That is, the operation point moves to point A.

The operation point control from point C to point D and from point D to point A can be carried out after battery pack 21 are charged or discharged several times.

Another method of controlling the SOC ratio when the constant-power voltage does not move along the normal characteristic curve is described with reference to a graph shown in FIG. 22 and a subroutine flow diagram shown in FIG. 23.

Figure 22:
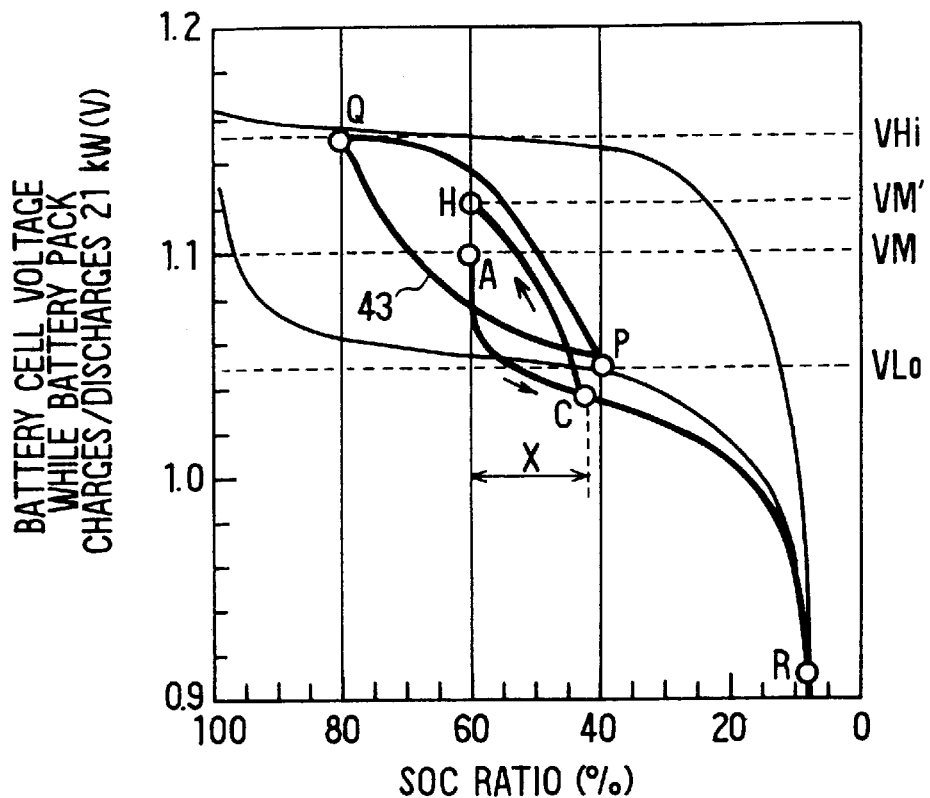
FIG. 22 is a graph showing a method of controlling the SOC ratio according to a variation of the second embodiment.
Figure 23:
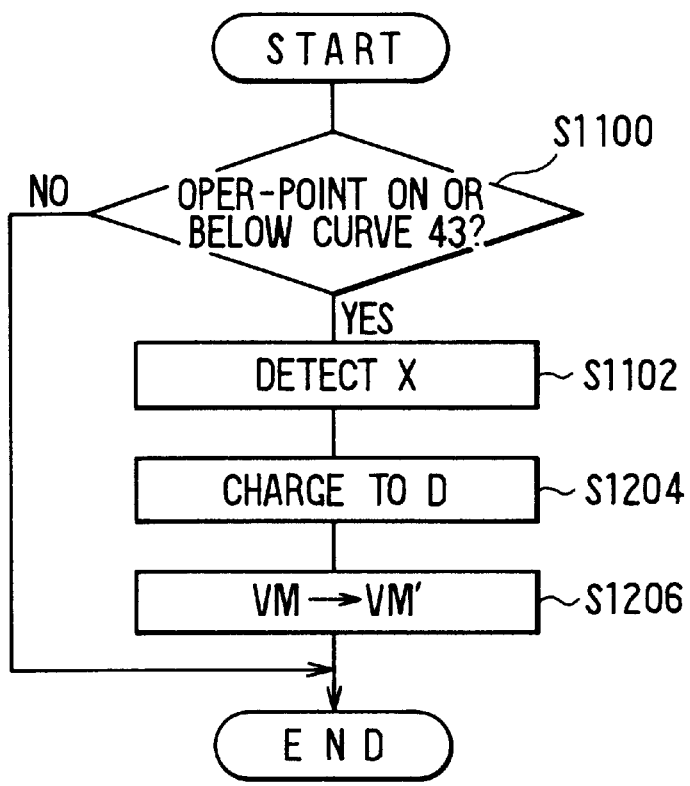
FIG. 23 is a flow diagram showing the variation of the method according to the second embodiment.

At step S1100 in FIG. 23, whether or not a present condition of the battery cells corresponding to an operating point shown in FIG. 22 is on or below curve 43 shown in FIG. 22 is examined by calculation similar to calculation shown in FIG. 16. If the result is NO, the subroutine ends. On the other hand, if the result is YES, difference X between 60% and the SOC ratio of operating point C is detected at step S1102. At step S1204, battery pack 22 is charged so that the SOC ratio becomes 60%. In other words, the operation point moves from point C to point H. Thereafter, target voltage VM is rewritten to no-load target voltage VM' at step S1206.

Figure 24:
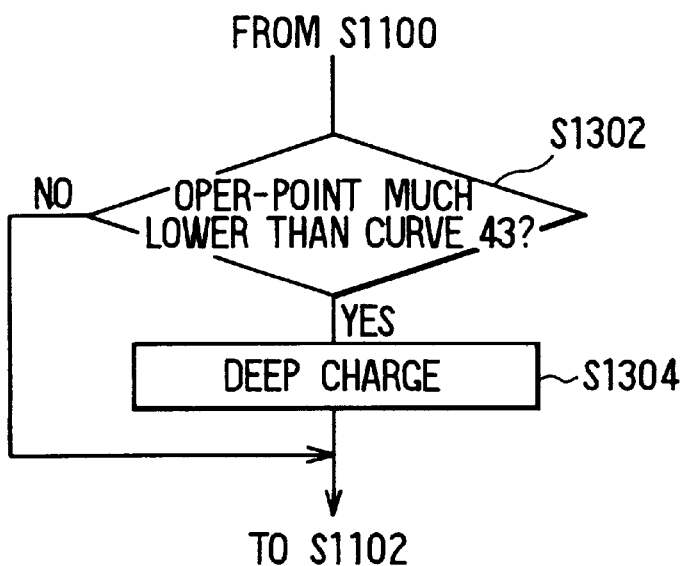
FIG. 24 is a flow diagram showing a variation of the flow diagram shown in FIG. 23.

In the above method, it is possible to insert steps of dissolving large memory effect of the battery cell between step S1100 and S1102 as shown in FIG. 24. At step S1302, whether the operation point is a certain voltage lower than curve 43 is examined. If the result is NO, the step goes to S1102. On the other hand, if the result is YES, a deep discharging treatment is given at step S1304 before going to step S1102.

The deep discharging treatment is well known as a method of dissolving the memory effect of batteries.

(Third Embodiment)

A method of controlling battery condition is described with reference to FIGS. 25 and 26.

Figure 25:
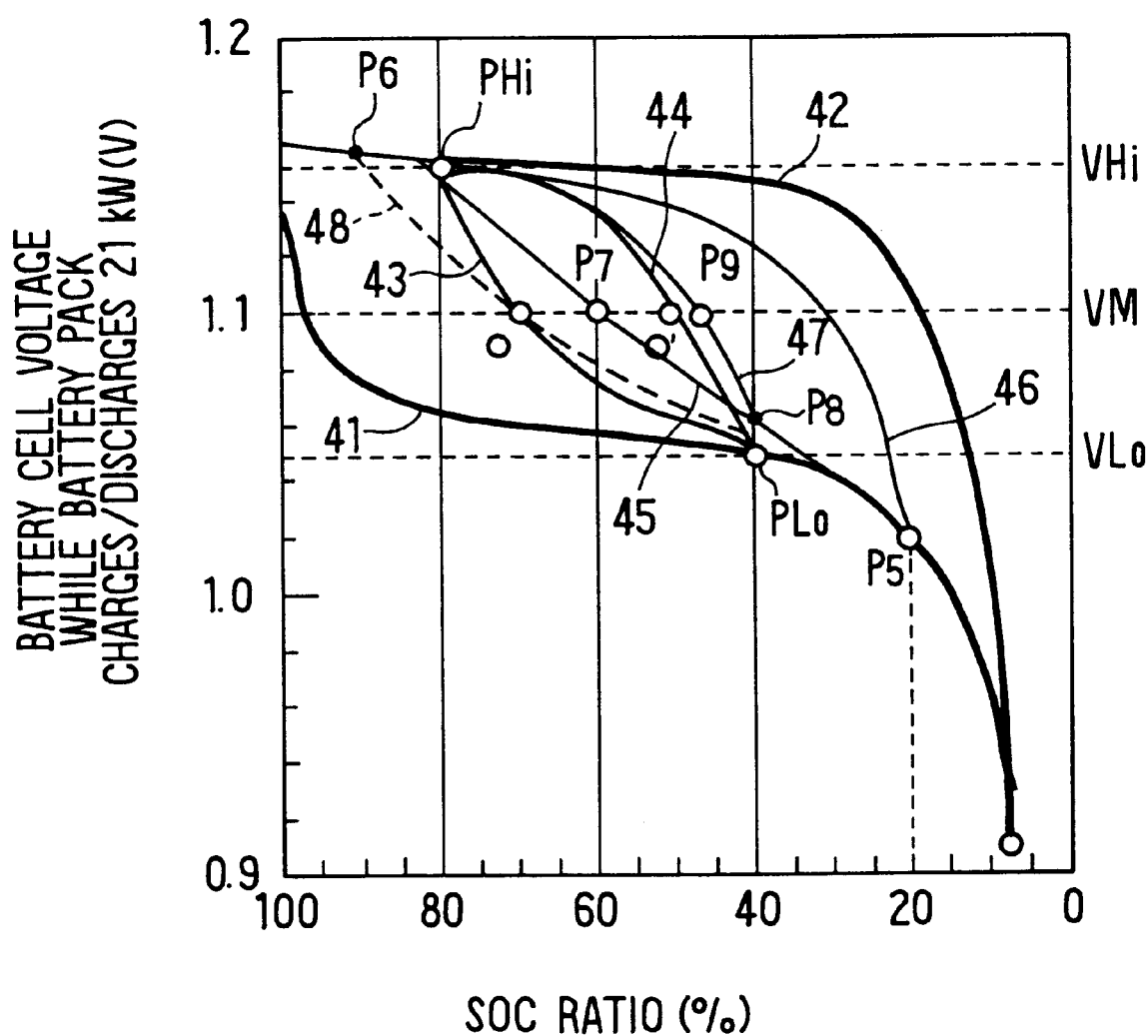
FIG. 25 is a graph showing a method of controlling the SOC ratio according to a third embodiment of the invention.
Figure 26:
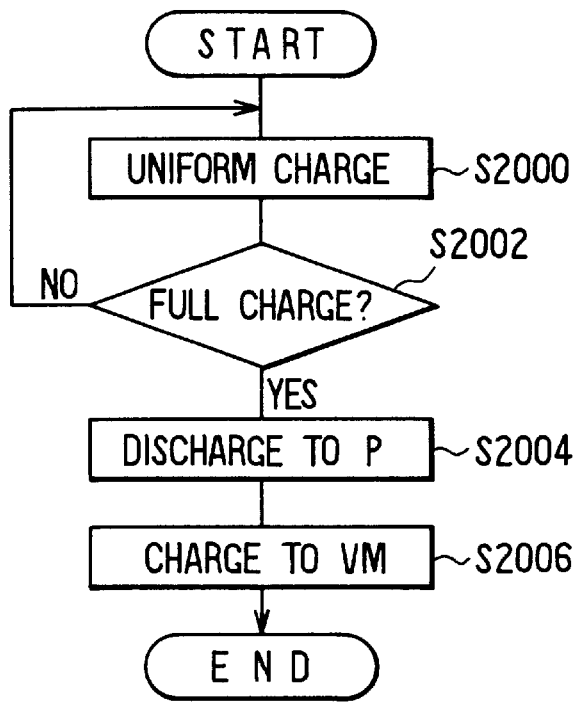
FIG. 26 is a flow diagram showing the method according to the third embodiment.

As shown in FIG. 25, if battery pack 21 is discharged excessively and its operation point moves along discharge characteristic curve 41 down to point P5, where the SOC ratio (e.g. 20%) becomes much lower than 40%, battery pack 21 is charged again to move the operation point to around PHi, from where the operation point moves along new discharge characteristic curve 45 through point P7 down to a point P8 around point PLo, thus returning to the normal control range.

The operation point moves from point P8 to point P9 along new charge characteristic curve 48 when battery pack 21 is charged again. This changes the SOC-ratio-control-range at target voltage VM from range O–O' to range P7–P9.

However, this range shift can be eliminated if battery pack 21 is discharged to lower the constant-power voltage to minimum-normal voltage VLo before controlling the constant-power voltage at target voltage VM. The range shift can be also eliminated if battery pack 21 is fully charged before controlling the constant-power voltage at target voltage VM.

This resetting operation is carried out regularly or automatically while the vehicle is running without assist of the battery power. In this resetting operation, battery pack 21 is charged continuously and uniformly with certain amounts of electric power in a uniform charging manner as in a flow diagram shown in FIG. 26.

At step S2000, battery pack is charged in the uniform charging manner, and whether the constant-power voltage VBw is fully charged or not is examined at step S2002.

If the result is YES, battery pack 21 is discharged until the constant-power voltage VBw approaches minimum-normal voltage VLo at step S2006, and the routine ends. On the other hand, if the result is NO, the uniform charging is continued.

(Fourth Embodiment)

A method controlling battery condition according to a fourth embodiment of the invention is described with reference to FIGS. 25 and 27.

At first, battery pack 21 is charged to move the operation point from point P5 along charge characteristic curve 46 to point P6 beyond PHi by a SOC ratio smaller than the difference between PLo and P5 in FIG. 25, from where the operation point moves along discharge characteristic curve 48, thus returning to the normal control range.

If the battery pack 21 is further discharged along discharge characteristic curve 48 to a point between PLo and P5, the operation control range at target voltage VM becomes closer to original control range O–O'.

The more the above resetting operation is repeated, the closer to the original range the control range becomes.

Figure 27:
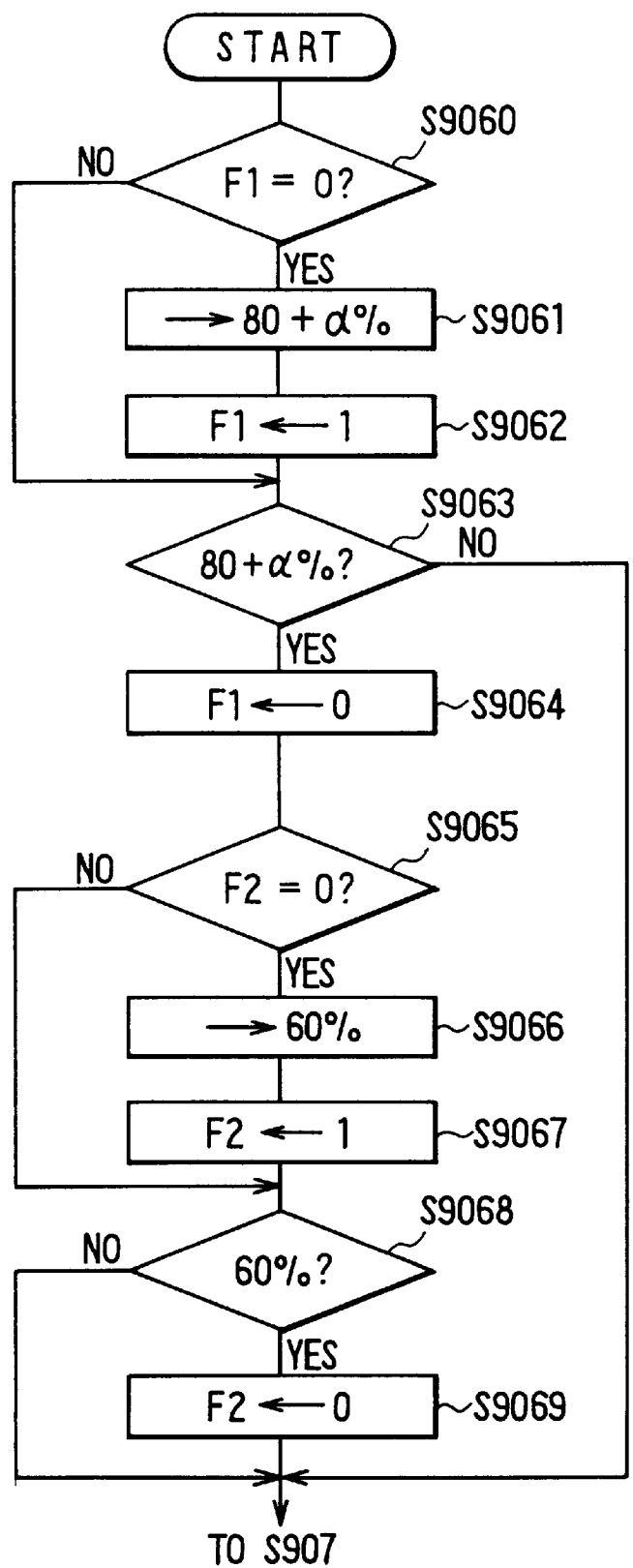
FIG. 27 is a flow diagram showing the method according to a fourth embodiment.

In FIG. 27 at step S9060, whether flag F1 is 1 or not is examined. If flag is 1, this indicates that battery pack is over-discharged and is charged so that the operation point moves from point P5 along charge characteristic curve 46 to point P6 shown in FIG. 25. If the result is NO, step S9063 follows. If the result is YES, step S9061 follows to set the target SOC ratio to 80%+α. Then, set flag F1 to 1 at the next step S9062. At step S9063, whether the SOC ratio is 80%+α or not is examined.

If the result is NO, the next step is S907 of the main routine. If the result is YES, the flag F1 is set to 0 at step S9064, because it is considered that the operation point of the battery cell has approached point P6 along charge curve 46. Then, whether flag F2 is 0 or not is examined at step S9065.

If the result is YES, step S9066 follows to set the target SOC ratio to 60% because this indicates that battery pack 21 is being discharged so that the operation point moves along discharge curve 45. Then, flag F2 is set to 1 at step S9067.

If the result of step S9065 is NO, step S9068 follows to examine whether the SOC ratio has approached 60% or not. If the result is NO, the next step is S907 of the main routine. If the result is YES, flag F2 is set to 0 before going to step S907 of the main routine.

(Fifth Embodiment)

Figure 28:
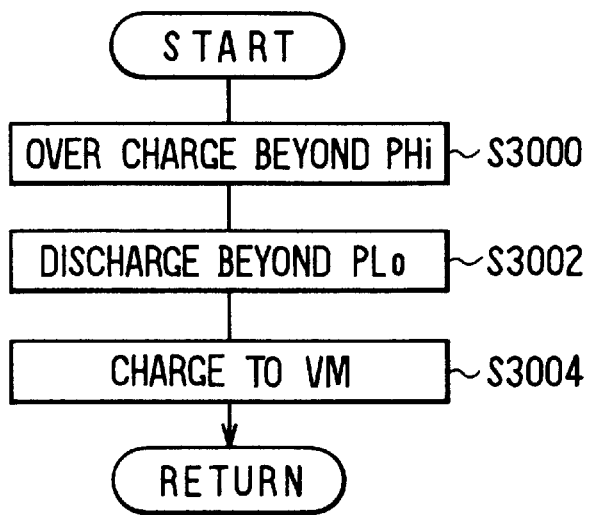
FIG. 28 is a flow diagram showing a method of controlling the SOC ratio according to a fifth embodiment of the invention.

Another method of controlling battery condition according to a fifth embodiment of the invention is described with reference to FIG. 25 and FIG. 28.

At step S3000, battery pack 21 is charged so that the operation point moves from point P5 along curve 46 to point P6 further than point PHi by a certain SOC ratio that is smaller than the difference in the SOC ratio between point PLo and point P5. Then, battery pack 21 is discharged so that the constant-power voltage becomes VLo at step S3002. Thereafter, battery pack 21 is charged again so that the constant-power voltage approaches target voltage VM.

(Sixth Embodiment)

Figure 29:
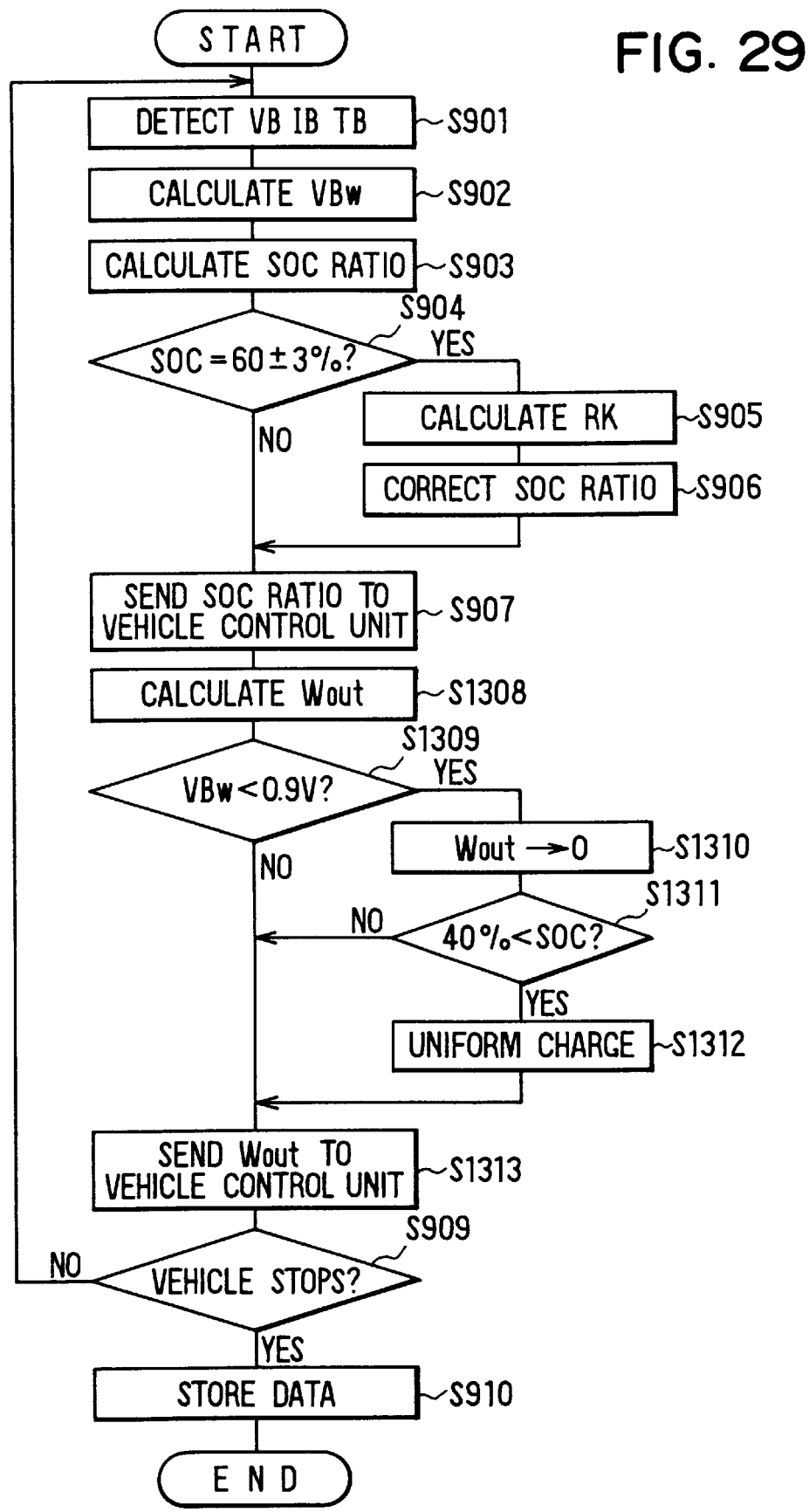
FIG. 29 is a flow diagram of a method of controlling the SOC ratio according to a sixth embodiment of the invention.

A method of controlling battery condition according to a sixth embodiment of the invention is described with reference to a flow chart shown in FIGS. 29 and 30.

In steps 901–907, the SOC ratio is calculated and running condition data VB, IB, TB in the same manner as described above. At step S1308, dischargeable power Wout of the battery cell and no load voltage VBo thereof are obtained by the following equation.

$$Wout = ((VBo - VP)/Rk) \cdot VLo$$

$$VBo = VB + RK \times IB$$

At step S1309, whether or not the constant-power voltage VBw of the battery cell is less than discharge stop voltage 0.9 V is examined. If the result is YES, Wout is set to 0 to stop the battery discharge at step S1310. Thereafter, Wout is sent to vehicle control unit 28 at step S1313. As long as vehicle control unit 28 controls the dischargeable power within Wout, the constant-power voltage would not become lower than minimum-normal voltage VLo. That is, any battery cell will not become over-discharged.

At step S1311, whether the SOC ratio is larger than 40% or not is examined. If the result is YES, and the uniform charging is commanded because battery pack 21 may have a battery cell of different remaining capacity. The uniform charging equalizes all the battery-cell capacities.

If the vehicle stops at step S909, all the parameters used in the steps are stored in a memory for the next control.

The SOC ratio at step S1310 can be stored as the minimum-normal SOC ratio for the next operation. For example, a target SOC ratio is set between the minimum-normal SOC ratio (e.g. SOC2 in FIG. 6) and the full SOC ratio (i.e. 100%) to equalize the remaining capacities of the battery cells being charged and the remaining capacities of the same being discharged, so that imbalance between the chargeable capacity and dischargeable capacity can be reduced.

At step S1308, dischargeable power Wout is controlled automatically. However, the constant-power voltage VBw becomes equal to minimum-normal voltage VLo although the constant-power voltage VBw is not examined.

Figure 30:
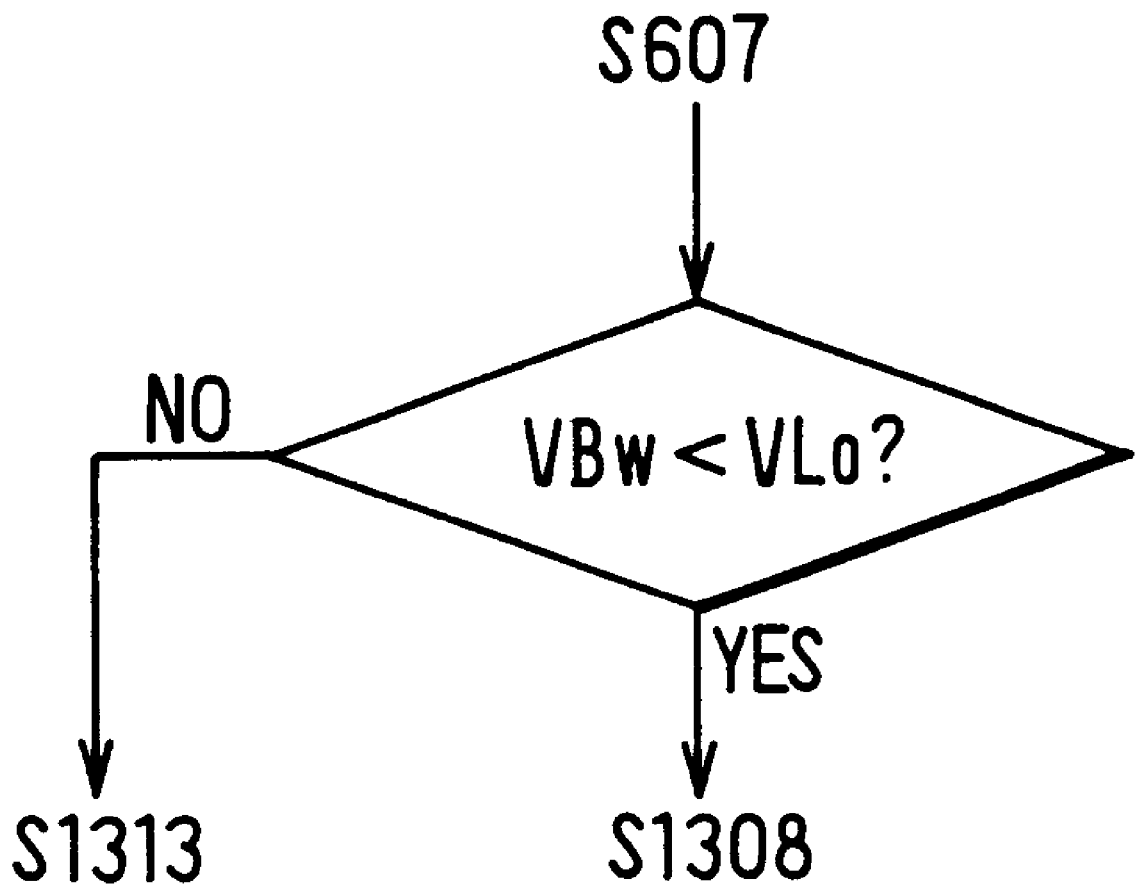
FIG. 30 is a variation of a portion of the flow diagram shown in FIG. 29.

As shown in FIG. 30, whether the constant-power voltage VBw becomes lower than minimum-normal voltage VLo is examined beforehand. If the result is NO, step S1308 is skipped, and Wout is set 21 kW at step S1313. On the other hand, if the result is YES, Wout calculated at step S1308 is sent to vehicle control unit 28 to control the discharge power.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A method of controlling condition of a battery of a self-generation electric vehicle, the method comprising the steps of:

detecting battery voltage and battery current repeatedly;

estimating a constant-power voltage on the basis of said battery voltage and battery current, said constant-power voltage being a function of a remaining capacity of said battery when a preset constant power is charged to or discharged from said battery;

setting a target voltage;

comparing said constant-power voltage with said target voltage to provide a difference therebetween; and charging or discharging said battery to reduce said difference.

2. The method as claimed in claim 1, further comprising the steps of:

setting a maximum-normal voltage and a minimum-normal voltage between a voltage level of said battery that is fully charged and a voltage level of said battery that is completely discharged; and stopping said battery current if said constant-power voltage level becomes out of a range between said maximum-normal voltage and said minimum-normal voltage.

3. The method as claimed in claim 2, wherein said target voltage is set at the middle of said maximum-normal voltage and said minimum-normal voltage.

4. The method as claimed in claim 3, further comprising the steps of:

estimating said remaining capacity of said battery by summing up said battery current; and correcting said estimated remaining capacity to said target remaining capacity when said constant-power-discharge voltage approaches said target voltage.

5. The method as claimed in claim 1, said battery is a nickel-hydrogen battery.

6. The method as claimed in claim 3, further comprising a step of resetting battery condition.

7. The method as claimed in claim 6, wherein said step of resetting battery charge-discharge condition comprises the steps of:

setting a reference condition range that is defined by a preset voltage range and a preset remaining capacity range;

setting an operation condition defined by said constant-power-discharge voltage and said estimated remaining capacity; and if said operation condition is found to be out of said reference condition range, controlling said battery current to change said operation condition to be out of a boundary defined by said maximum-normal voltage and said minimum-normal voltage and, subsequently controlling said battery current to return said constant-power voltage to said target voltage.

8. The method as claimed in claim 7, wherein if said operation condition is found to be lower than said reference condition range, said step of controlling said battery current comprises a step of charging battery with an amount of power less than the power corresponding to a difference in remaining capacity between said preset remaining capacity and said estimated capacity.

9. A method of controlling condition of a battery of a self-generation electric vehicle, said method comprising the steps of:

detecting battery voltage and battery current;

calculating constant-power voltage of said battery on the basis of said battery voltage and said battery current, said constant-power voltage being a function of a remaining capacity of said battery when a preset constant power is charged to or discharged from said battery;

setting a minimum remaining capacity and a maximum remaining capacity;

setting a target voltage between a voltage level corresponding to said minimum remaining capacity and a voltage level corresponding to said maximum remaining capacity; and controlling said constant-power voltage to approach said target voltage, wherein said step of controlling comprises the steps of:

charging said battery so that said constant power voltage becomes approximately said maximum normal voltage and subsequently discharging said battery so that said constant power voltage approaches approximately said target voltage, if said constant power voltage is found to be lower than said voltage level corresponding to said minimum normal capacity.

10. The method as claimed in claim 9, wherein said step of controlling said battery current comprises a step of charging said battery so that said remaining capacity does not exceed said maximum normal capacity by a difference between said minimum normal capacity and a remaining capacity corresponding to said constant-power voltage.

11. The method as claimed in claim 9, wherein said battery comprises a nickel-hydrogen battery.

12. A method of controlling condition of a battery of a self-generation electric vehicle, said method comprising the steps of:

detecting battery voltage and battery current;

calculating constant-power voltage of said battery on the basis of said battery voltage and said battery current, said constant-power voltage being a function of a remaining capacity of said battery when a preset constant power is charged to or discharged from said battery;

setting a minimum normal capacity and a maximum normal capacity;

setting a target voltage between a voltage level corresponding to said minimum normal capacity and a voltage level corresponding to said maximum normal capacity; and controlling said constant-power voltage to approach said target voltage, wherein said step of controlling comprises the steps of:

comparing said constant-power voltage with said voltage level corresponding to said minimum normal capacity; and fully charging said battery and subsequently to discharging said battery so that said constant-power voltage becomes approximately said voltage level corresponding to said minimum normal capacity and discharge said battery again below said target voltage before said constant-power voltage is controlled to approach said target value, if said constant power voltage is found to be lower than said voltage level corresponding to said minimum normal capacity.

13. The method as claimed in claim 12, wherein said step of fully charging comprises a plurality of steps of uniform charging.

14. A method of operating an assembled battery of a self-generation electric vehicle, said method comprising the steps of:

detecting voltage and current of said battery;

calculating a constant-power voltage of said battery at its discharging a maximum normal power on the basis of said detected voltage and current, said constant-power voltage being a function of a remaining capacity of said battery when a preset constant power is charged to or discharged from said battery;;

setting a minimum normal capacity;

setting a minimum normal voltage that correspond to said minimums normal remaining capacity; and reducing power to be discharged from said battery if said constant-power voltage approaches said minimum normal voltage.

15. The method as claimed in claim 14, wherein said minimum normal voltage is set to correspond to an SOC ratio between 5–20%.

16. The method as claimed in claim 14, further comprising the steps of:

comparing said constant-power voltage with said minimum normal voltage; and fully charging said battery before said constant-power voltage is controlled to approach said target value, if said constant power voltage is found to be lower than said minimum normal voltage, wherein said step of fully charging comprises a plurality of steps of uniform charging.

* * * * *